United States Patent
Chen et al.

(10) Patent No.: US 9,748,222 B2
(45) Date of Patent: Aug. 29, 2017

(54) FIN TYPE ELECTROSTATIC DISCHARGE PROTECTION DEVICE

(71) Applicant: UNITED MICROELECTRONICS CORP., Hsin-Chu (TW)

(72) Inventors: Yu-Chun Chen, Hsinchu County (TW); Ping-Chen Chang, Pingtung County (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/144,836

(22) Filed: May 3, 2016

(65) Prior Publication Data
US 2016/0351558 A1 Dec. 1, 2016

Related U.S. Application Data

(62) Division of application No. 14/723,482, filed on May 28, 2015, now Pat. No. 9,368,484.

(51) Int. Cl.
| | |
|---|---|
| *H01L 27/02* | (2006.01) |
| *H01L 27/088* | (2006.01) |
| *H01L 29/78* | (2006.01) |
| *H01L 29/06* | (2006.01) |
| *H01L 27/12* | (2006.01) |
| *H01L 29/08* | (2006.01) |
| *H01L 29/10* | (2006.01) |
| *H01L 29/417* | (2006.01) |

(52) U.S. Cl.
CPC ...... *H01L 27/0266* (2013.01); *H01L 27/0248* (2013.01); *H01L 27/0886* (2013.01); *H01L 27/1211* (2013.01); *H01L 29/0649* (2013.01); *H01L 29/0653* (2013.01); *H01L 29/0847* (2013.01); *H01L 29/1033* (2013.01); *H01L 29/41791* (2013.01); *H01L 29/7851* (2013.01)

(58) Field of Classification Search
CPC ............ H01L 27/0266; H01L 27/1211; H01L 27/0248; H01L 27/0886; H01L 29/1033; H01L 29/0653; H01L 29/0649; H01L 29/0847; H01L 29/41791; H01L 29/7851
See application file for complete search history.

(56) References Cited

U.S. PATENT DOCUMENTS

| | | | |
|---|---|---|---|
| 2007/0040221 A1* | 2/2007 | Gossner | H01L 27/0288 257/355 |
| 2009/0280582 A1* | 11/2009 | Thijs | H01L 27/0248 438/14 |
| 2013/0193526 A1 | 8/2013 | Lo | |

(Continued)

*Primary Examiner* — Benjamin Sandvik
*Assistant Examiner* — Farid Khan
(74) *Attorney, Agent, or Firm* — Winston Hsu

(57) ABSTRACT

A fin type ESD protection device includes at least one first fin, at least one second fin, and at least one gate structure. The first fin is disposed on a semiconductor substrate, and a source contact contacts the first fin. The second fin is disposed on the semiconductor substrate, and a drain contact contacts the second fin. The first fin and the second fin extend in a first direction respectively, and the first fin is separated from the second fin. The gate structure is disposed between the source contact and the drain contact. The first fin is separated from the drain contact, and the second fin is separated from the source contact.

15 Claims, 18 Drawing Sheets

(56) References Cited

U.S. PATENT DOCUMENTS

| | | | |
|---|---|---|---|
| 2014/0092506 A1 | 4/2014 | Ahsan | |
| 2014/0131765 A1* | 5/2014 | Tsai | H01L 27/0255 |
| | | | 257/133 |
| 2014/0299943 A1* | 10/2014 | Lin | H01L 21/823431 |
| | | | 257/401 |
| 2015/0014809 A1 | 1/2015 | Wang | |
| 2015/0311342 A1 | 10/2015 | Lin | |
| 2016/0372468 A1* | 12/2016 | Wang | H01L 27/027 |
| 2016/0379971 A1* | 12/2016 | Lin | H01L 29/7848 |
| | | | 438/283 |

* cited by examiner

FIN TYPE ELECTROSTATIC DISCHARGE PROTECTION DEVICE

CROSS REFERENCE TO RELATED APPLICATIONS

This application is a division of and claims priority to U.S. patent application Ser. No. 14/723,482, filed May 28, 2015, the disclosure of which is incorporated in its entirety herein by reference thereto.

BACKGROUND OF THE INVENTION

1. Field of the Invention

The present invention relates to a fin type electrostatic discharge (ESD) protection device, and more particularly, to a fin type ESD protection device having high channel resistance for better ESD protection ability.

2. Description of the Prior Art

The conventional planar metal-oxide-semiconductor (hereinafter abbreviated as MOS) transistor has difficulty when scaling down to 65 nm and below. Therefore, the non-planar transistor technology such as Fin Field effect transistor (hereinafter abbreviated as FinFET) technology that allows smaller size and higher performance is developed to replace the planar MOS transistor. For example, dual-gate FinFET device, tri-gate FinFET device, and omega-FinFET device have been provided. Furthermore, gate-all-around (GAA) nanowire FET device is progressed for achieving the ongoing goals of High performance, low cost, increased miniaturization of integrated circuit components, and greater packaging density of integrated circuits. However, the FinFET suffers electrostatic discharge (ESD) issues because the ESD current tends to flow through the relatively smaller fin channel region and cause damage to the FinFET, and the fin type device has to be further modified for enhancing the ESD protection ability.

SUMMARY OF THE INVENTION

It is one of the objectives of the present invention to provide a fin type electrostatic discharge (ESD) protection device. The fin type ESD protection device is modified to have high channel resistance for changing the ESD current path and enhancing the ESD protection ability accordingly.

A fin type ESD protection device is provided in an embodiment of the present invention. The fin type ESD protection device includes at least one first fin, at least one second fin, and at least one gate structure. The first fin is disposed on a semiconductor substrate, and a source contact contacts the first fin. The second fin is disposed on the semiconductor substrate, and a drain contact contacts the second fin. The first fin and the second fin extend in a first direction respectively, and the first fin is separated from the second fin. The gate structure is disposed between the source contact and the drain contact. The first fin is separated from the drain contact, and the second fin is separated from the source contact.

A fin type ESD protection device is provided in another embodiment of the present invention. The fin type ESD protection device includes at least one fin structure and a plurality of gate structures. The fin structure is disposed on a semiconductor substrate, and the fin structure extends in a first direction. The fin structure includes at least one first section, at least one second section, and at least one third section. A source contact contacts the first section, and a drain contact contacts the second section. The third section is disposed between the first section and the second section in the first direction. The first section and the second section are first conductivity type sections. The gate structures are disposed between the source contact and the drain contact in the first direction, and no section directly connected to the source contact or the drain contact is disposed between the gate structures.

According to the fin type ESD protection device in the present invention, the current path is changed by separating the fins connected to the source contact and the drain contact respectively or disposing a plurality of the gate structures between the source contact and the drain contact. Current from the drain contact may pass through a bulk region in the semiconductor substrate and the ESD protection ability of the fin type ESD protection device may be enhanced accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
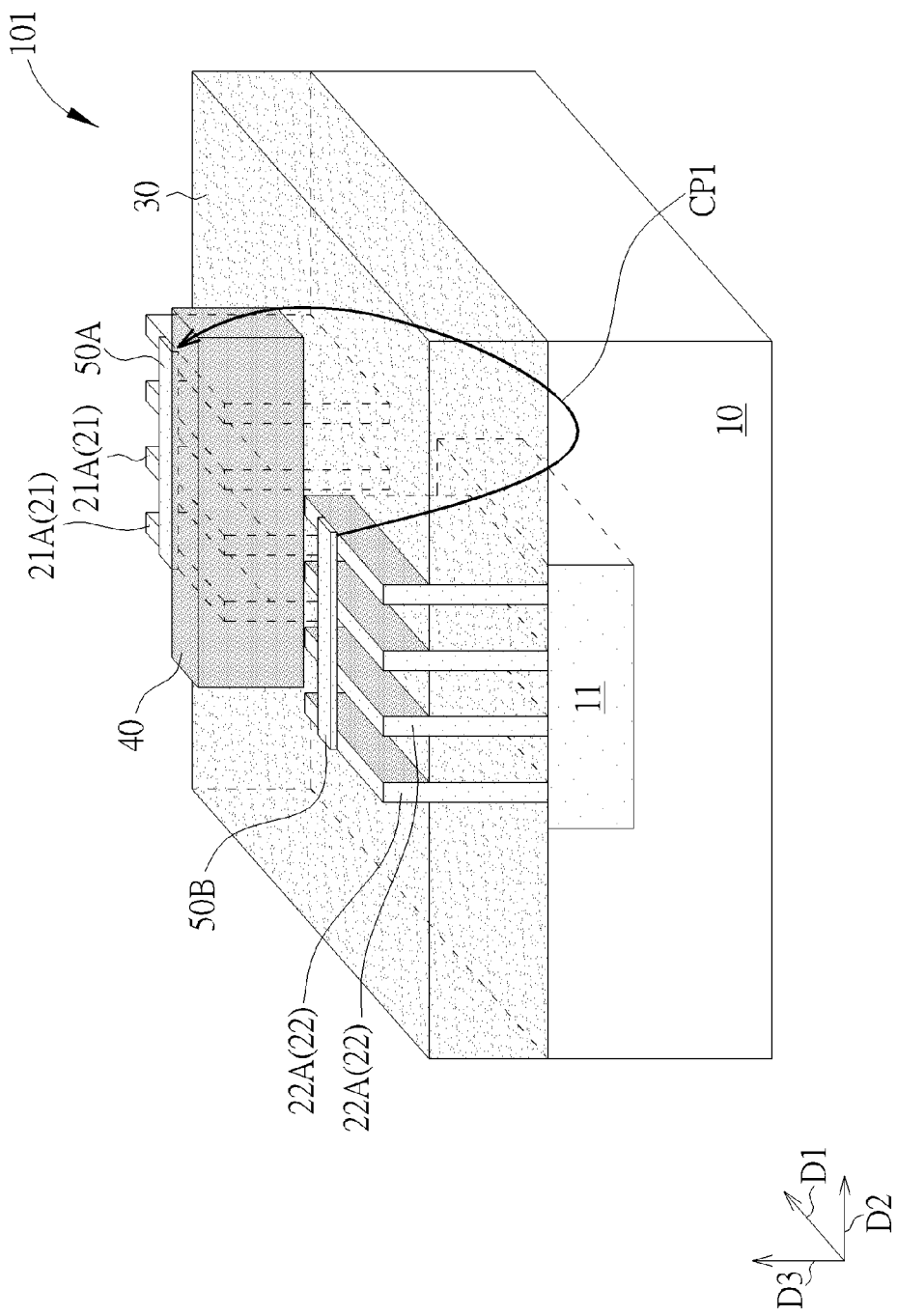
FIG. 1 is a stereoscopic schematic diagram illustrating a fin type electrostatic discharge (ESD) protection device according to a first embodiment of the present invention.
Figure 2:
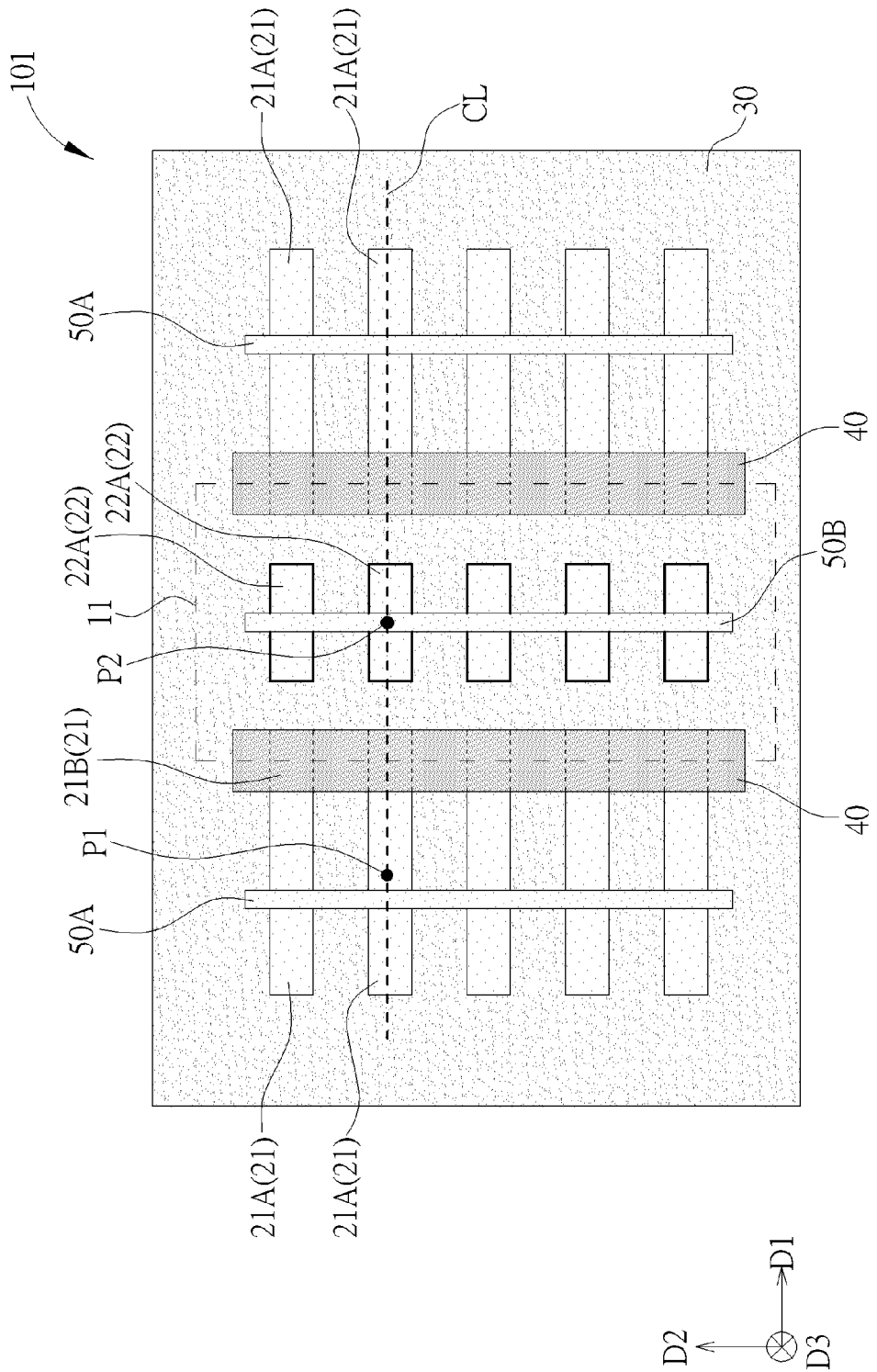
FIG. 2 is a schematic top view diagram illustrating the fin type ESD protection device according to the first embodiment of the present invention.

Please refer to FIG. 1 and FIG. 2. FIG. 1 is a stereoscopic schematic diagram illustrating a fin type electrostatic discharge (ESD) protection device according to a first embodiment of the present invention. FIG. 2 is a schematic top view diagram illustrating the fin type ESD protection device in this embodiment. As shown in FIG. 1 and FIG. 2, a fin type ESD protection device 101 is provided in this embodiment. The fin type ESD protection device 101 includes at least one first fin 21, at least one second fin 22, and at least one gate structure 40. The first fin 21 and the second fin 22 are disposed on a semiconductor substrate 10. The semiconductor substrate 10 of this embodiment may include a silicon substrate, an epitaxial silicon substrate, a silicon germanium substrate, a silicon carbide substrate, or a silicon-on-insulator (SOI) substrate, but not limited thereto. A source contact 50A contacts the first fin 21, and a drain contact 50B contacts the second fin 22. The first fin 21 and the second fin 22 extend in a first direction D1 respectively, and the first fin 21 is separated from the second fin 22. The gate structure 40 is disposed between the source contact 50A and the drain contact 50B. The gate structure 40 extends in a second direction D2 substantially perpendicular to the first direction D1, but not limited thereto. The gate structure 40 may include a metal gate structure, a polysilicon gate structure, or other appropriate structures. In this embodiment, the gate structure 40 may be a dummy gate structure without signals applied thereto preferably, but the present invention is not limited to this. The first fin 21 is separated from the drain contact 50B, and the second fin 22 is separated from the source contact 50A. In other word, the first fin 21 is only connected to the source contact 50A, and the second fin 22 is only connected to the drain contact 50B.

As shown in FIG. 1 and FIG. 2, the fin type ESD protection device 101 may include a plurality of the gate structures 40, a plurality of the first fins 21 and a plurality of the second fins 22. Each of the gate structures 40 is disposed between a pair of the source contact 50A and the drain contact 50B. The first fins 21 and the second fins 22 are disposed at different sides of each of the gate structure 40 in the first direction D1 respectively. Each of the first fins 21 is aligned with one of the second fins 22 in the first direction D1. From a top view of the fin type ESD protection device 101, a center point P1 of each of the first fins 21 and a center point P2 of the corresponding second fin 22 in the first direction D1 are positioned on an identical straight line CL extending in the first direction D1. Additionally, the fin type ESD protection device 101 may further include a shallow trench isolation (STI) 30 disposed between the first fins 21 and the second fin 22 in the first direction D1, and the first fins 21 and the second fins 22 are separated from one another by the STI 30. In this embodiment, there is not any fin disposed between the gate structure 40 and the second fin 22 in the first direction D1, and the second fin 22 is separated from the corresponding first fin 21 in the first direction D1 by the STI 30. In this embodiment, each of the first fins 21 includes a first part 21A having a first conductivity type, and each of the second fins 22 includes a second part 22A having the first conductivity type. The semiconductor substrate 10 may include a second conductivity type well or/and the semiconductor substrate 10 may be a second conductivity type substrate. The second conductivity type is complementary to the first conductivity type. For example, the first conductivity type may be n-type and the second conductivity type may be p-type, but not limited thereto. In this embodiment, each of the first fins 21 may further include a third part 21B disposed under the gate structure 40, and a side surface of the third part 21B of the first fin 21 may be aligned with a side surface of the corresponding gate structure 40, but not limited thereto. The third part 21B of the first fin 21 is connected to and contacts the first part 21A of the same first fin 21 and separated from the corresponding second fin 22 in the first direction D1. The third part 21B of the first fin 21 may be a second conductivity type part, a lightly doped first conductivity type part, or a non-doped part, but not limited thereto. Because the second fins 21 connected to the drain contact 50B is separated from the first fins 22 in this embodiment, an electric current from the drain contact 50B may be guided to the source contact 50A by passing through the second part 22A, a bulk region in the semiconductor substrate 10 (such as the second conductivity type well in the semiconductor substrate 10), and the first part 21A, and the ESD protection ability of the fin type ESD protection device 101 may be enhanced accordingly.

In addition, the fin type ESD protection device 101 may further include a first conductivity type well 11 disposed in the semiconductor substrate 10. The second fins 22 are disposed on the first conductivity type well 11, and the second fins 22 contact and are electrically connected to the first conductivity type well 11. The first conductivity type well 11 may extend to a region under the gate structure 40, and each of the gate structures 40 may overlap a part of the first conductivity type well 11 in a vertical direction D3. The first conductivity type well 11 may contact the third part 21B of the first fin 21 under the gate structure 40, and the fin type ESD protection device 101 may be a workable transistor accordingly, but not limited thereto. The electric current from the drain contact 50B may be guided to the source contact 50A by passing through the second part 22A, the first conductivity type well 11, the bulk region in the semiconductor substrate 10, and the first part 21A sequentially (such as a current path CP1 shown in FIG. 1), and the ESD protection ability of the fin type ESD protection device 101 may be further enhanced accordingly. It is worth noting that the current path CP1 is substantially parallel to the first direction D1 because the first fin 21 and the second fin 22 are disposed corresponding to one another in the first direction D1.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
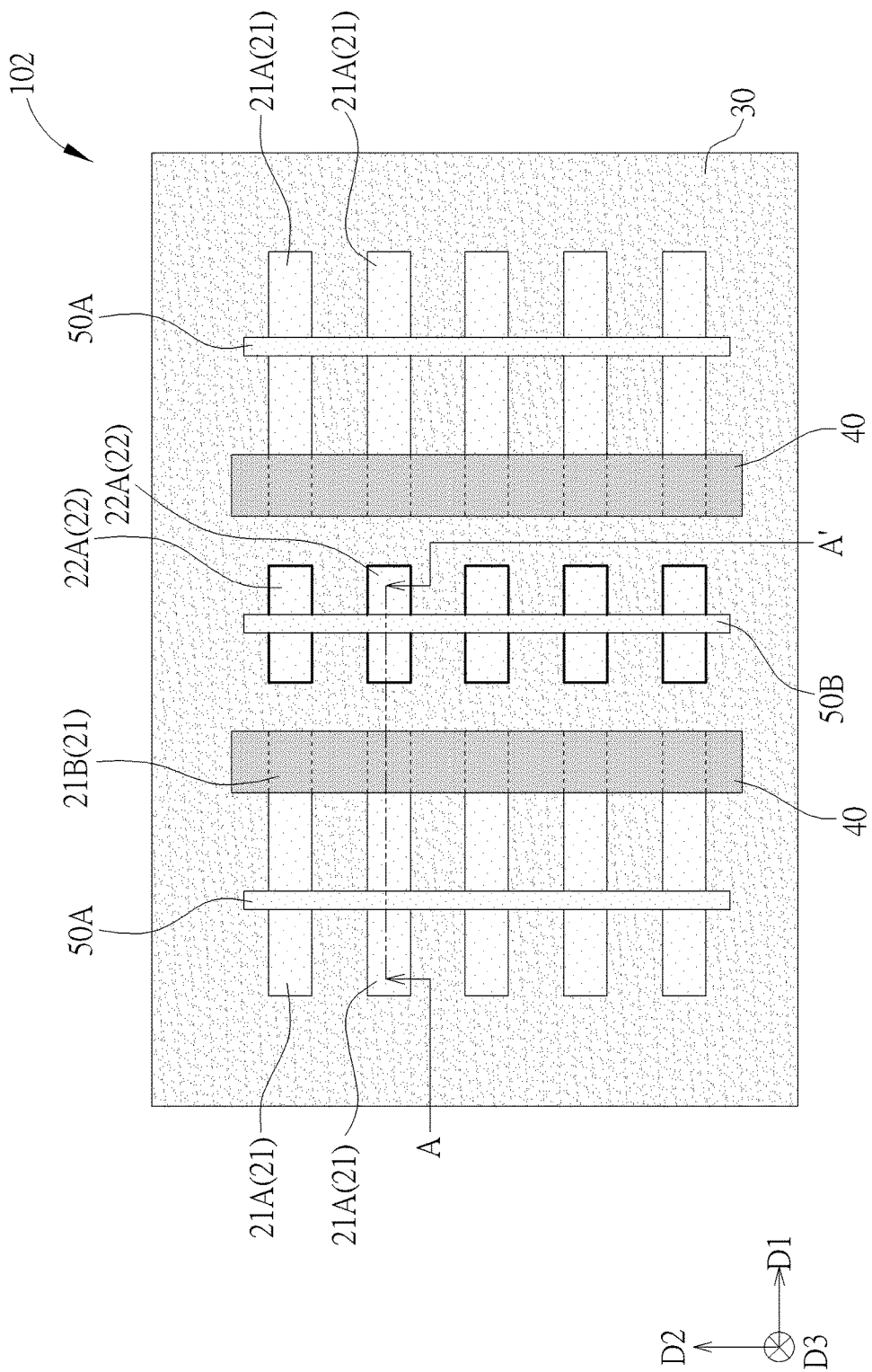
FIG. 3 is a schematic top view diagram illustrating a fin type ESD protection device according to a second embodiment of the present invention.
Figure 4:
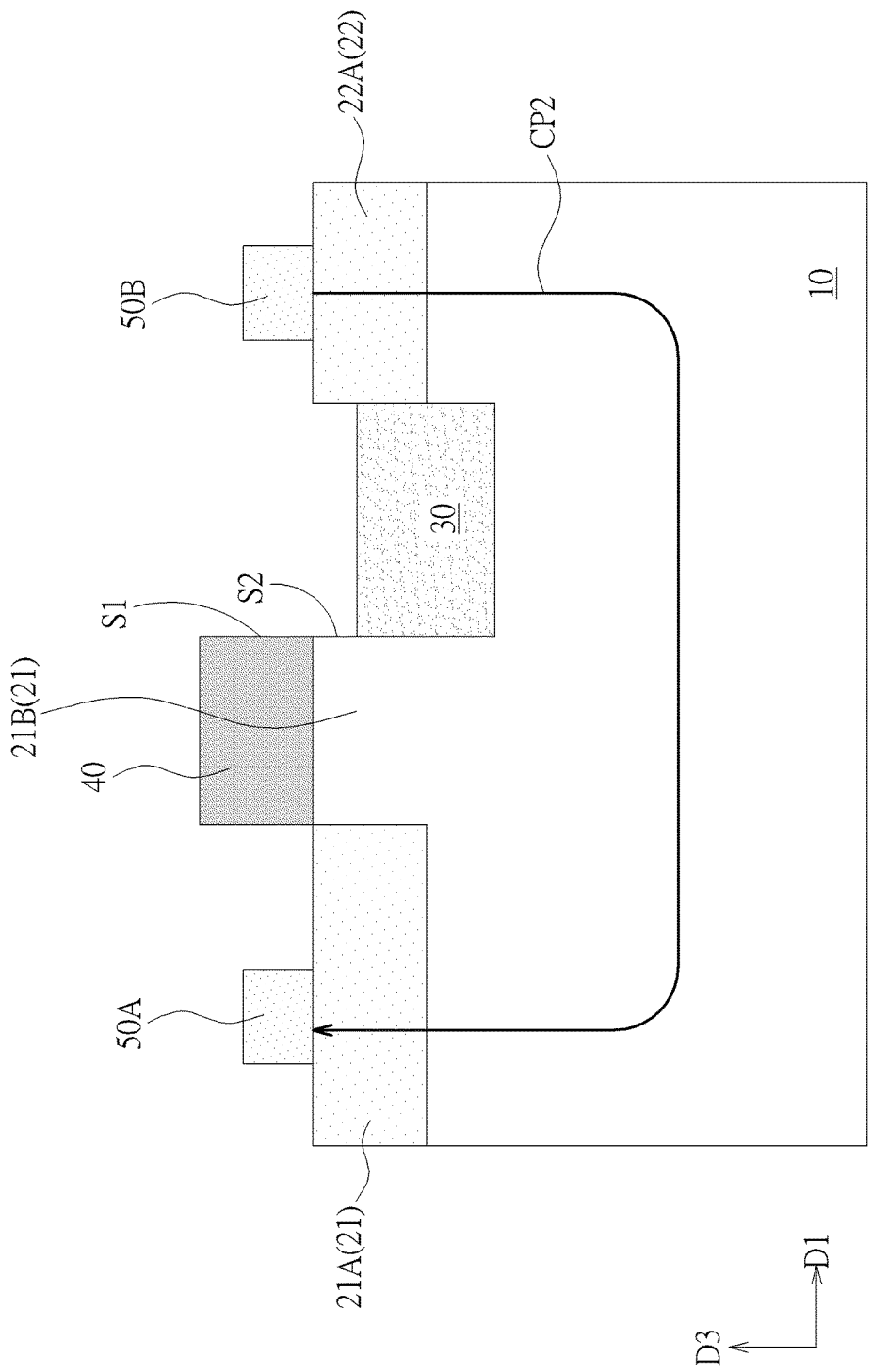
FIG. 4 is a cross-sectional drawing taken along a line A-A' in FIG. 3.

Please refer to FIG. 3 and FIG. 4. FIG. 3 is a schematic top view diagram illustrating a fin type ESD protection device 102 according to a second embodiment of the present invention. FIG. 4 is a cross-sectional drawing taken along a line A-A' in FIG. 3. As shown in FIG. 3 and FIG. 4, the difference between the fin type ESD protection device 102 in this embodiment and the fin type ESD protection device in the first embodiment is that the fin type ESD protection device 102 does not include the first conductivity type well in the first embodiment. As shown in FIG. 4, a side surface S2 of the third part 21B of the first fin 21 may be aligned with a side surface S1 of the gate structure 40, but the present invention is not limited to this. In other embodiments of the present invention, the gate structure 40 may cover the side surface S2 of the third part 21B of the first fin 21. Additionally, a length of the gate structure 40 and the STI 30 in the first direction D1 may be adjusted to modify a length of a current path CP2 in the fin type ESD protection device 102.

Figure 5:
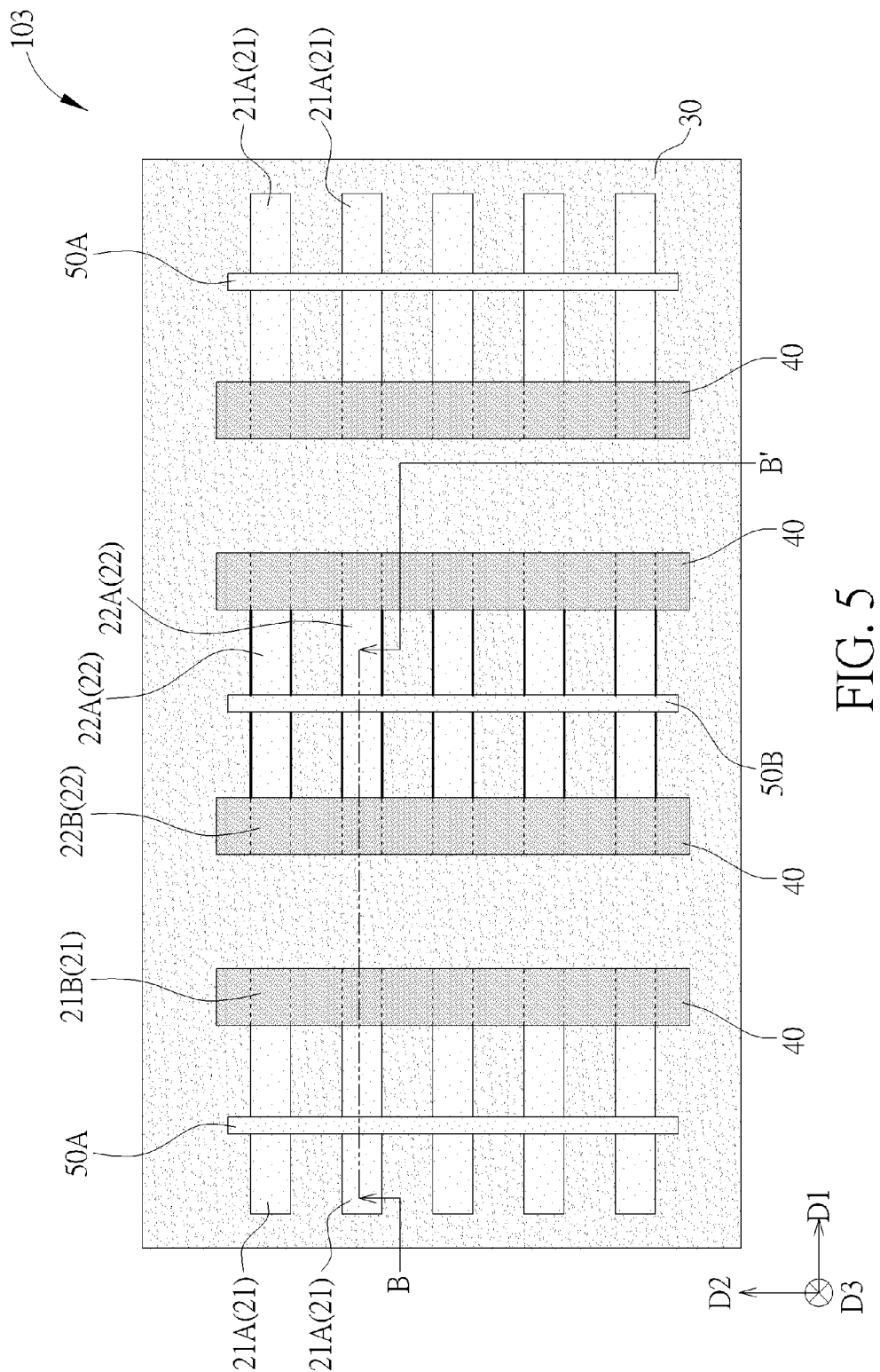
FIG. 5 is a schematic top view diagram illustrating a fin type ESD protection device according to a third embodiment of the present invention.
Figure 6:
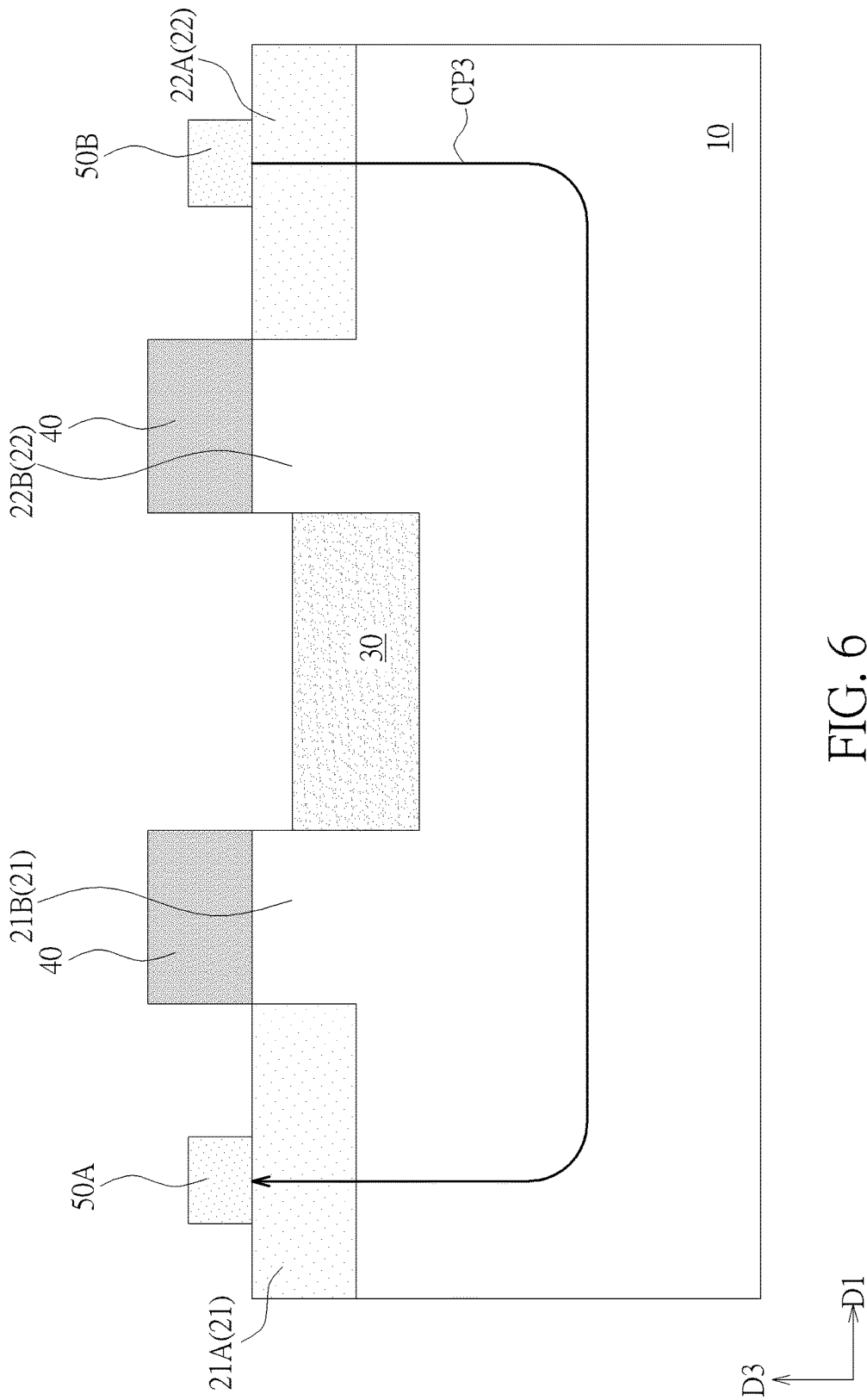
FIG. 6 is a cross-sectional drawing taken along a line B-B' in FIG. 5.

Please refer to FIG. 5 and FIG. 6. FIG. 5 is a schematic top view diagram illustrating a fin type ESD protection device 103 according to a third embodiment of the present invention. FIG. 6 is a cross-sectional drawing taken along a line B-B' in FIG. 5. As shown in FIG. 5 and FIG. 6, the difference between the fin type ESD protection device 103 in this embodiment and the fin type ESD protection device in the second embodiment is that the fin type ESD protection device 103 includes a plurality of the gate structures 40 disposed between a pair of the source contact 50A and the drain contact 50B in the first direction D1, and each of the gate structures 40 may extend in the second direction D2, but not limited thereto. In this embodiment, each of the second fins 22 may further include a fourth part 22B disposed under one of the gate structures 40, and the fourth part 22B of the second fin 22 is connected to and contacts the second part 22A of the same second fin 22. The fourth part 22B of the second fin 22 may be a second conductivity type part, a lightly doped first conductivity type part, or a non-doped part, but not limited thereto. In this embodiment, there is not any fin disposed between the first fin 21 and the second fin 22 in the first direction D1, and there is not any fin disposed between the gate structures 40 between a pair of the first fin 21 and the second fin 22 aligned in the first direction D1, but the present invention is not limited to this. The STI 30 is disposed between the third part 21B of the first fin 21 and the fourth part 22B of the second fin 22 for separating the first fin 21 from the second fin 22 in the first direction D1. A length of the gate structures 40 and the STI 30 in the first direction D1 may be adjusted to modify a length of a current path CP3 in the fin type ESD protection device 103.

Figure 7:
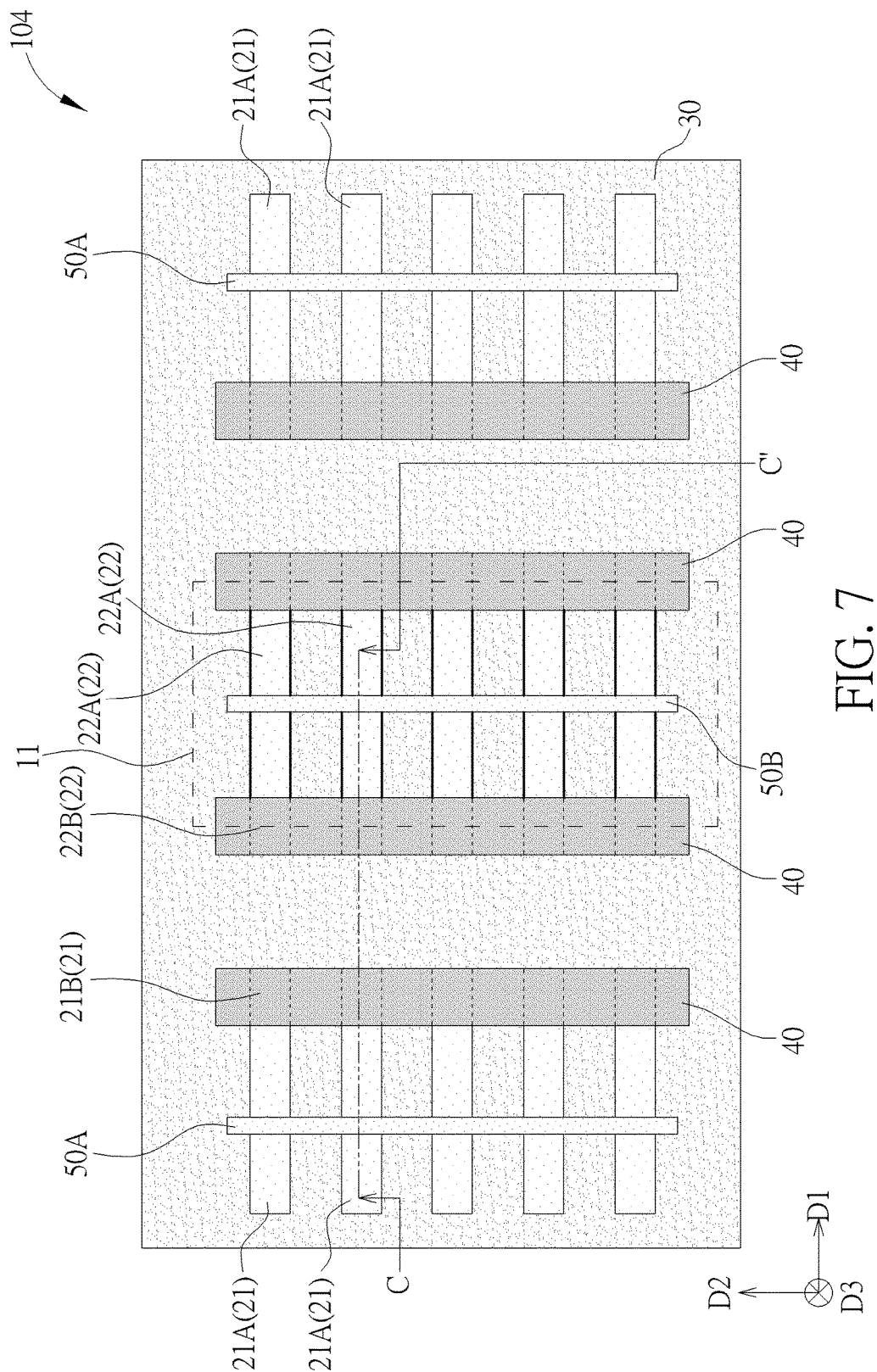
FIG. 7 is a schematic top view diagram illustrating a fin type ESD protection device according to a fourth embodiment of the present invention.
Figure 8:
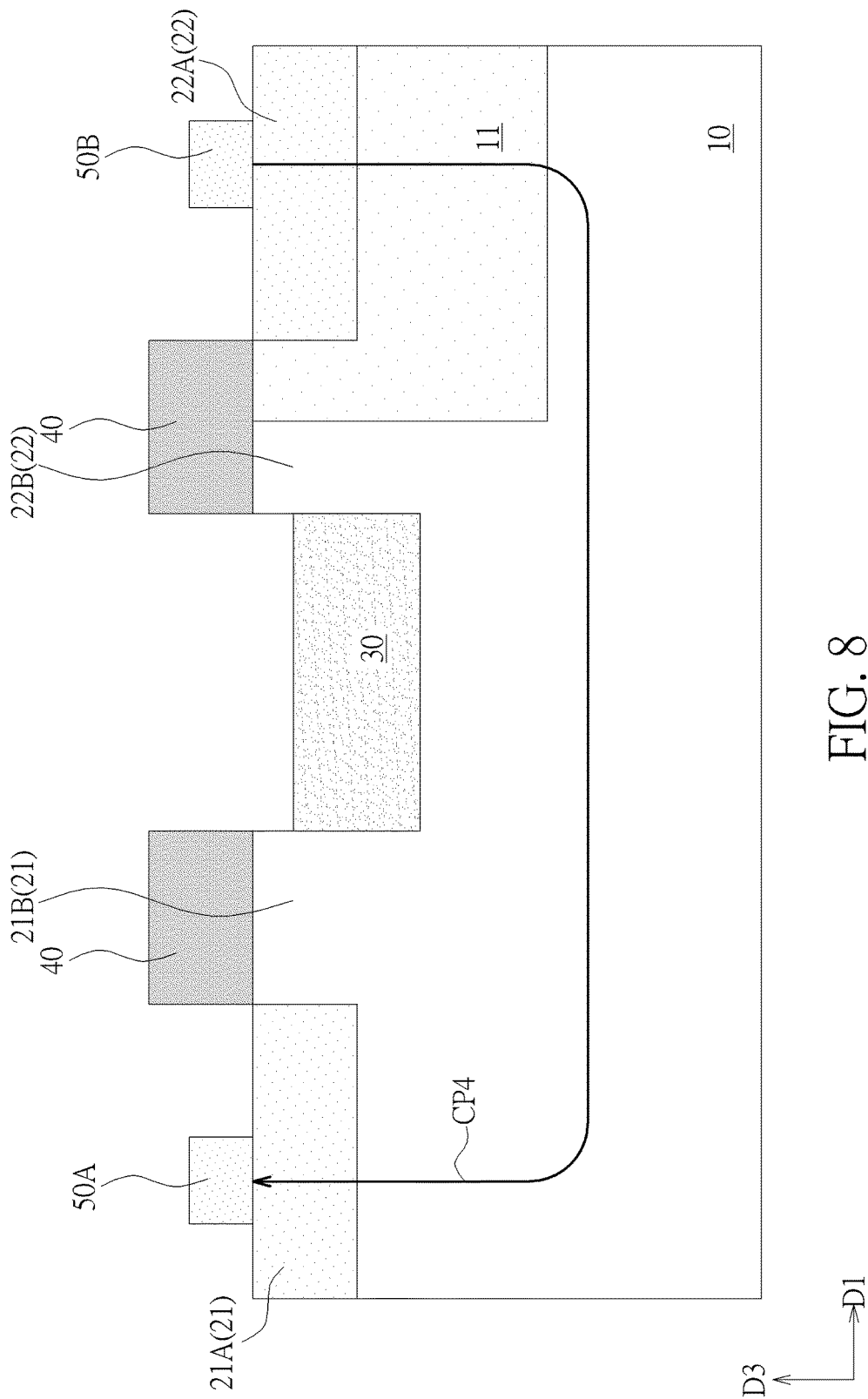
FIG. 8 is a cross-sectional drawing taken along a line C-C' in FIG. 7.

Please refer to FIG. 7 and FIG. 8. FIG. 7 is a schematic top view diagram illustrating a fin type ESD protection device 104 according to a fourth embodiment of the present invention. FIG. 8 is a cross-sectional drawing taken along a line C-C' in FIG. 7. As shown in FIG. 7 and FIG. 8, the difference between the fin type ESD protection device 104 in this embodiment and the fin type ESD protection device in the third embodiment is that the fin type ESD protection device 104 further include a first conductivity type well 11 disposed in the semiconductor substrate 10. The second fins 22 are disposed on the first conductivity type well 11, and the second fins 22 contact and are electrically connected to the first conductivity type well 11. The first conductivity type well 11 may extend to a region under the gate structure 40, and the corresponding gate structure 40 may overlap a part of the first conductivity type well 11 in the vertical direction D3. The first conductivity type well 11 may contact the fourth part 22B of the second fin 22 under the gate structure 40, but not limited thereto. The electric current from the drain contact 50B may be guided to the source contact 50A by passing through the second part 22A, the first conductivity type well 11, the bulk region in the semiconductor substrate 10, and the first part 21A sequentially (such as a current path CP4 shown in FIG. 8), and a length of the gate structures 40 and the STI 30 in the first direction D1 may be adjusted to modify a length of a current path CP4 in the fin type ESD protection device 104.

Figure 9:
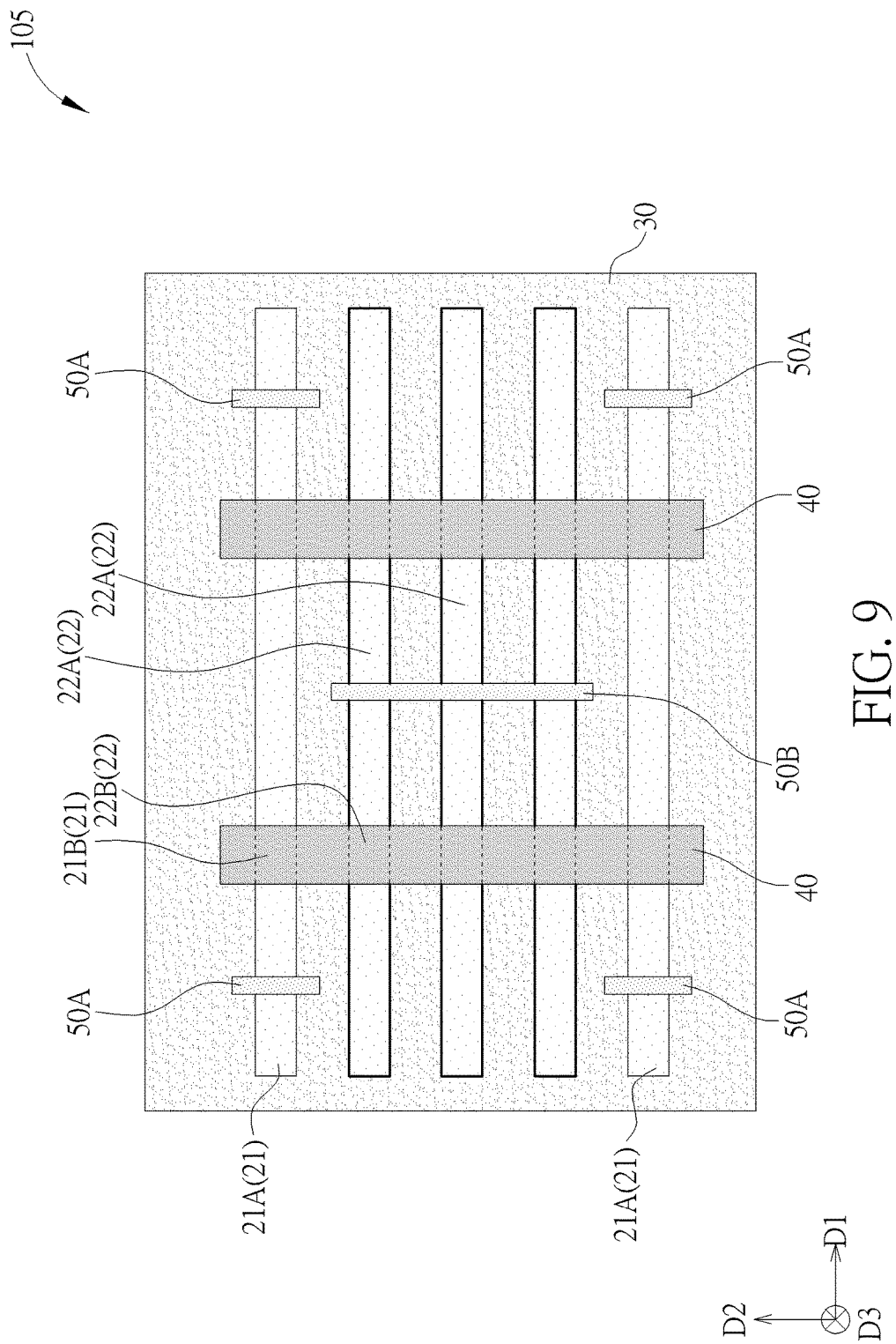
FIG. 9 is a schematic top view diagram illustrating a fin type ESD protection device according to a fifth embodiment of the present invention.

Please refer to FIG. 9. FIG. 9 is a schematic top view diagram illustrating a fin type ESD protection device 105 according to a fifth embodiment of the present invention. As shown in FIG. 9, the difference between this embodiment and the second embodiment is that in the fin type ESD protection device 105, each of the first fins 21 is parallel to the second fins 22, and the first fins 21 and the second fins 22 are alternately disposed in the second direction D2. From the top view diagram of the fin type ESD protection device 105, each of the first fins 21 does not overlap the second fins 22 in the first direction D1. In other words, the source contact 50A and the drain contact 50B are connected to fins in different rows. The electric current from the drain contact 50B may be guided to the source contact 50A by passing through the second part 22A, the bulk region in the semiconductor substrate 10, and the first part 21A sequentially instead of directly passing through the fourth part 22B of the second fin 21 and the third part 21B of the first fin 21 under the gate structure 40, and the ESD protection ability of the fin type ESD protection device 105 may be further enhanced accordingly. The first fins 21 and the second fins 22 may be identical in length and be disposed separately in the second direction D2. Each of the gate structures 40 may overlap both the third part 21B of the first fin 21 and the fourth part 22B of the second fin 22.

Figure 10:
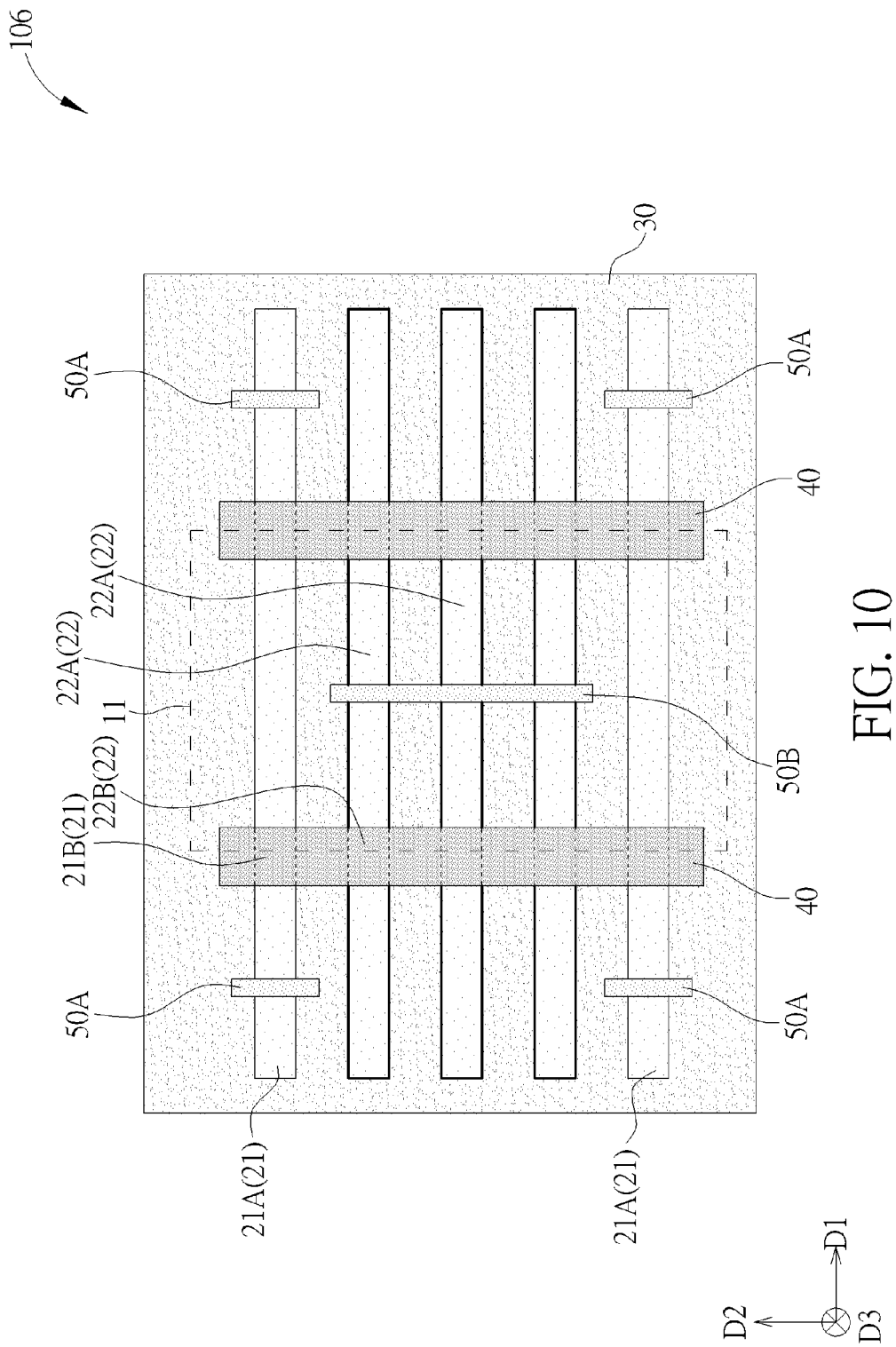
FIG. 10 is a schematic top view diagram illustrating a fin type ESD protection device according to a sixth embodiment of the present invention.

Please refer to FIG. 10. FIG. 10 is a schematic top view diagram illustrating a fin type ESD protection device 106 according to a sixth embodiment of the present invention. As shown in FIG. 10, the difference between the fin type ESD protection device 106 in this embodiment and the fin type ESD protection device in the fifth embodiment is that the fin type ESD protection device 106 further include the first conductivity type well 11 mentioned above. The second fins 22 are disposed on the first conductivity type well 11, and the gate structures 40 may overlap a part of the first conductivity type well 11 in the vertical direction D3.

Figure 11:
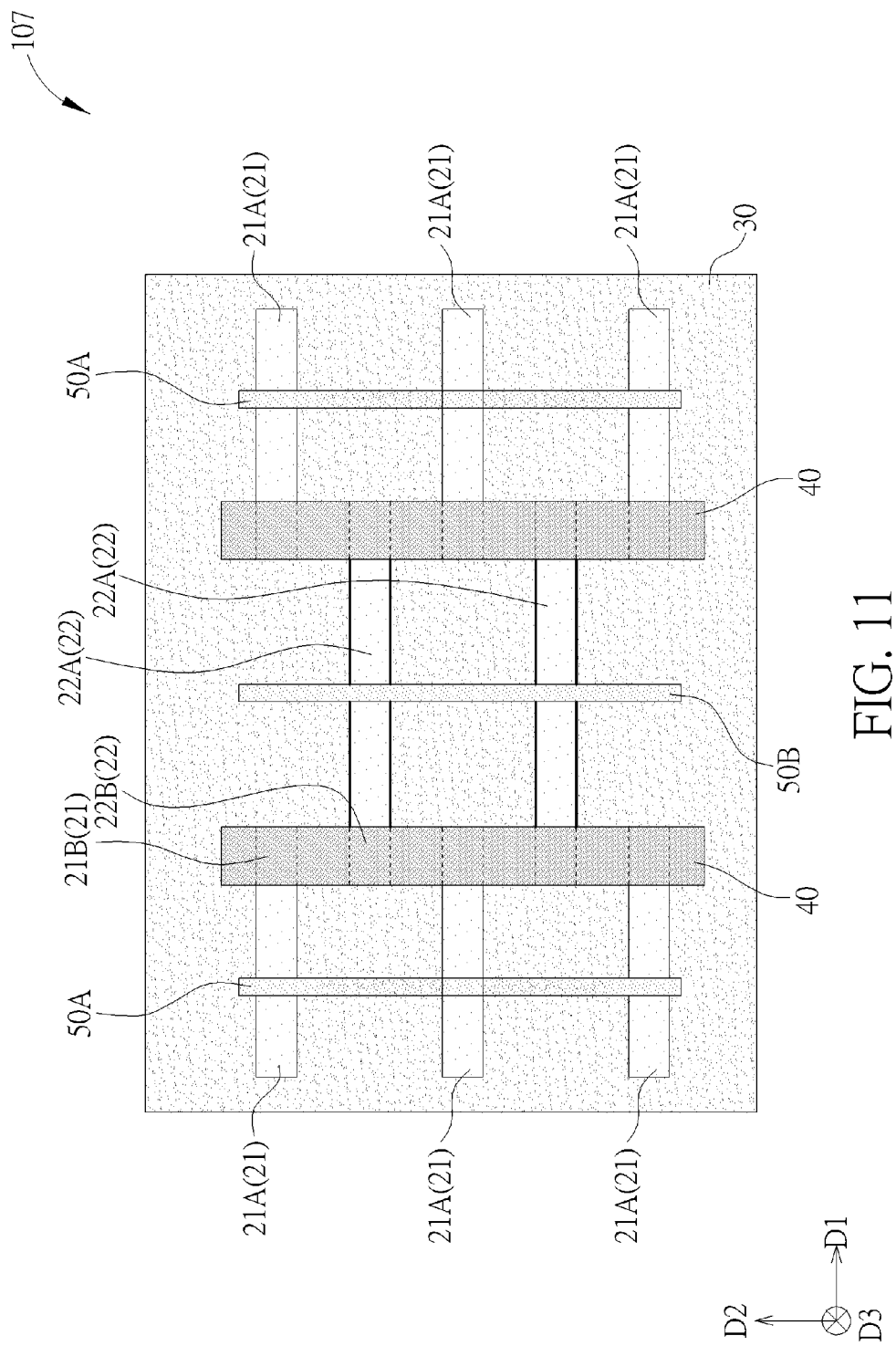
FIG. 11 is a schematic top view diagram illustrating a fin type ESD protection device according to a seventh embodiment of the present invention.

Please refer to FIG. 11. FIG. 11 is a schematic top view diagram illustrating a fin type ESD protection device 107 according to a seventh embodiment of the present invention. As shown in FIG. 11, in the fin type ESD protection device 107, the first part 21A of the first fin 21 and the second part 22A of the second fin 22 are uncovered by the gate structure 40. The third part 21B of the first fin 21 and the fourth part 22B of the second fin 22 are disposed under the gate structure 40. The difference between the fin type ESD protection device 107 in this embodiment and the fin type ESD protection device in the fifth embodiment is that, in this embodiment, each of the first fins 21 and each of the second fins 22 are shifted relatively in the first direction D1 and in the second direction D2. From the top view diagram of the fin type ESD protection device 107, the first part 21A of the first fin 21 does not overlap the second part 22A of the second fin 22 in the second direction D2 perpendicular to the first direction D1. The first part 21A of the first fin 21 is disposed on one side of the gate structure 40, and the second part 22A of the second fin 22 is disposed on an opposite side of the gate structure 40 in the first direction D1. In this way, each of the source contacts 50A may be disposed to be connected to all of the first fins 21 disposed at the same side of the gate structure 40.

Figure 12:
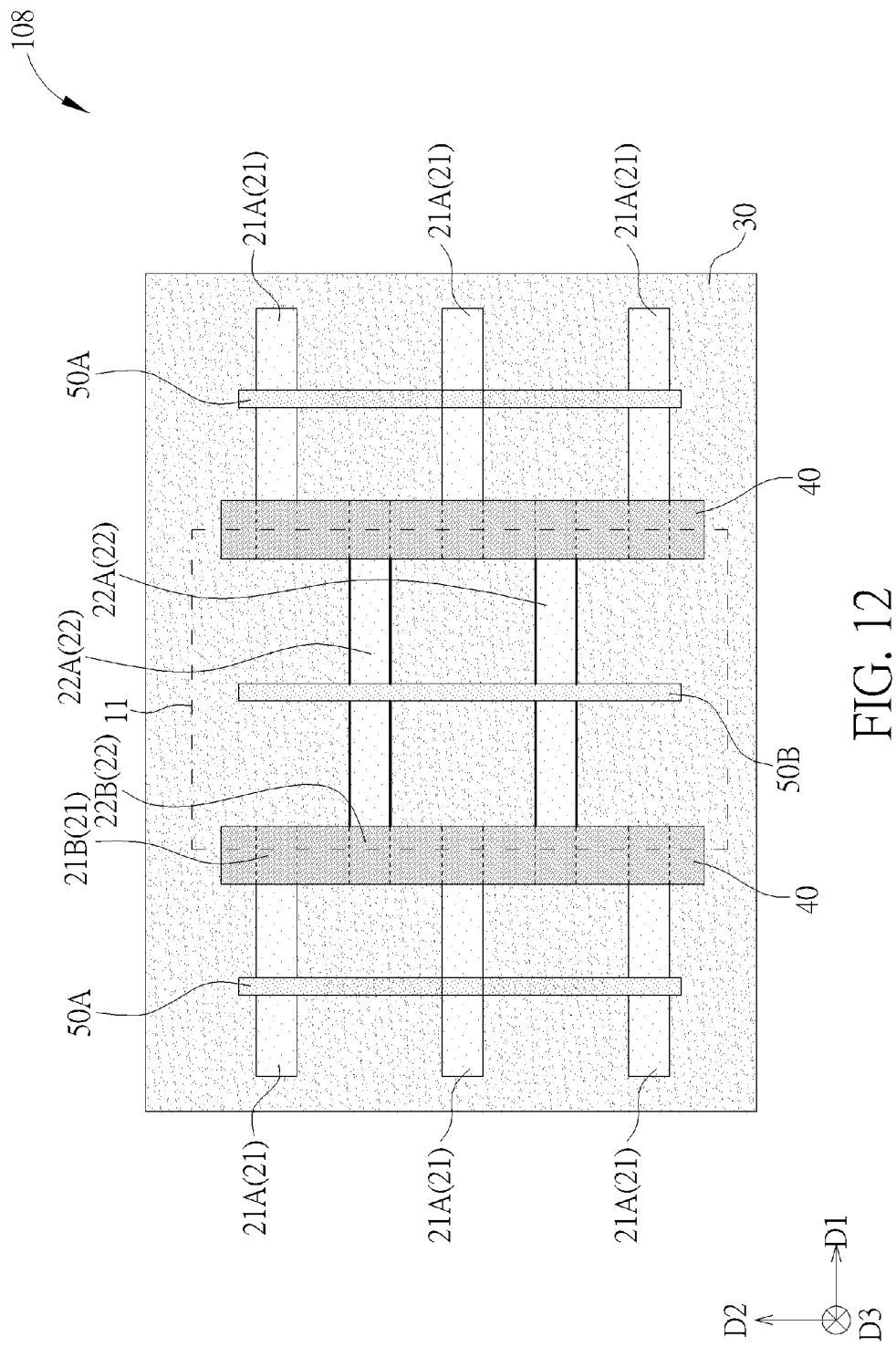
FIG. 12 is a schematic top view diagram illustrating a fin type ESD protection device according to an eighth embodiment of the present invention.

Please refer to FIG. 12. FIG. 12 is a schematic top view diagram illustrating a fin type ESD protection device 108 according to an eighth embodiment of the present invention. As shown in FIG. 12, the difference between the fin type ESD protection device 108 in this embodiment and the fin type ESD protection device in the seventh embodiment is that the fin type ESD protection device 108 further includes the first conductivity type well 11 mentioned above. The second fins 22 are disposed on the first conductivity type well 11, and the gate structures 40 may overlap a part of the first conductivity type well 11 in the vertical direction D3.

Figure 13:
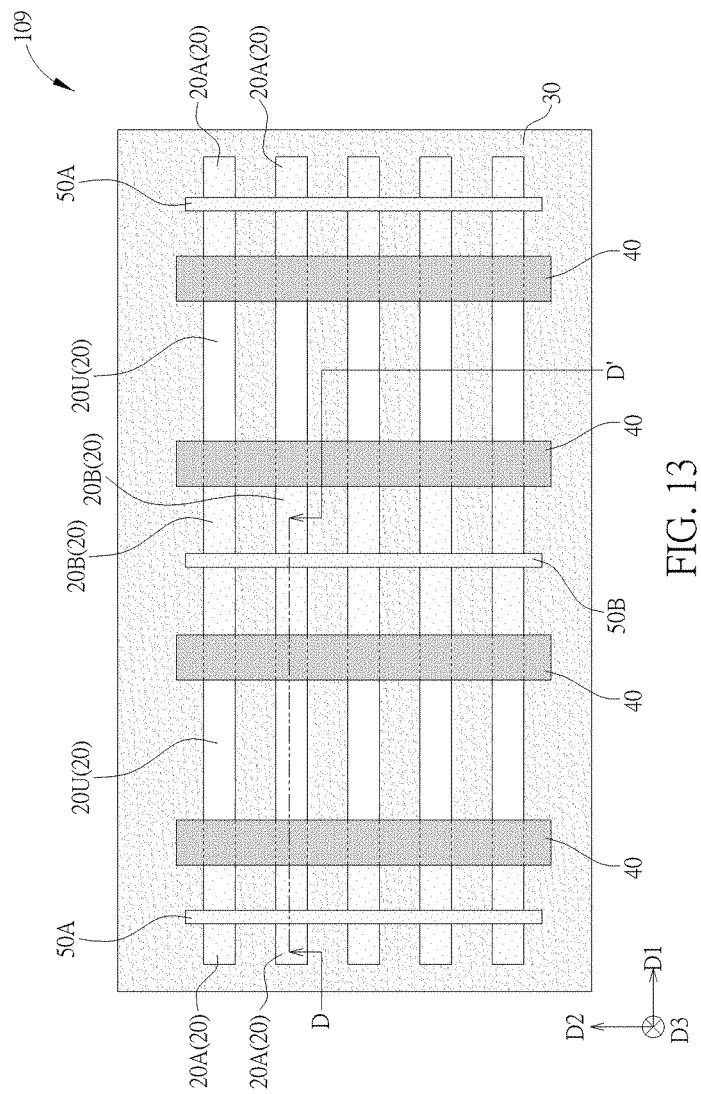
FIG. 13 is a schematic top view diagram illustrating a fin type ESD protection device according to a ninth embodiment of the present invention.
Figure 14:
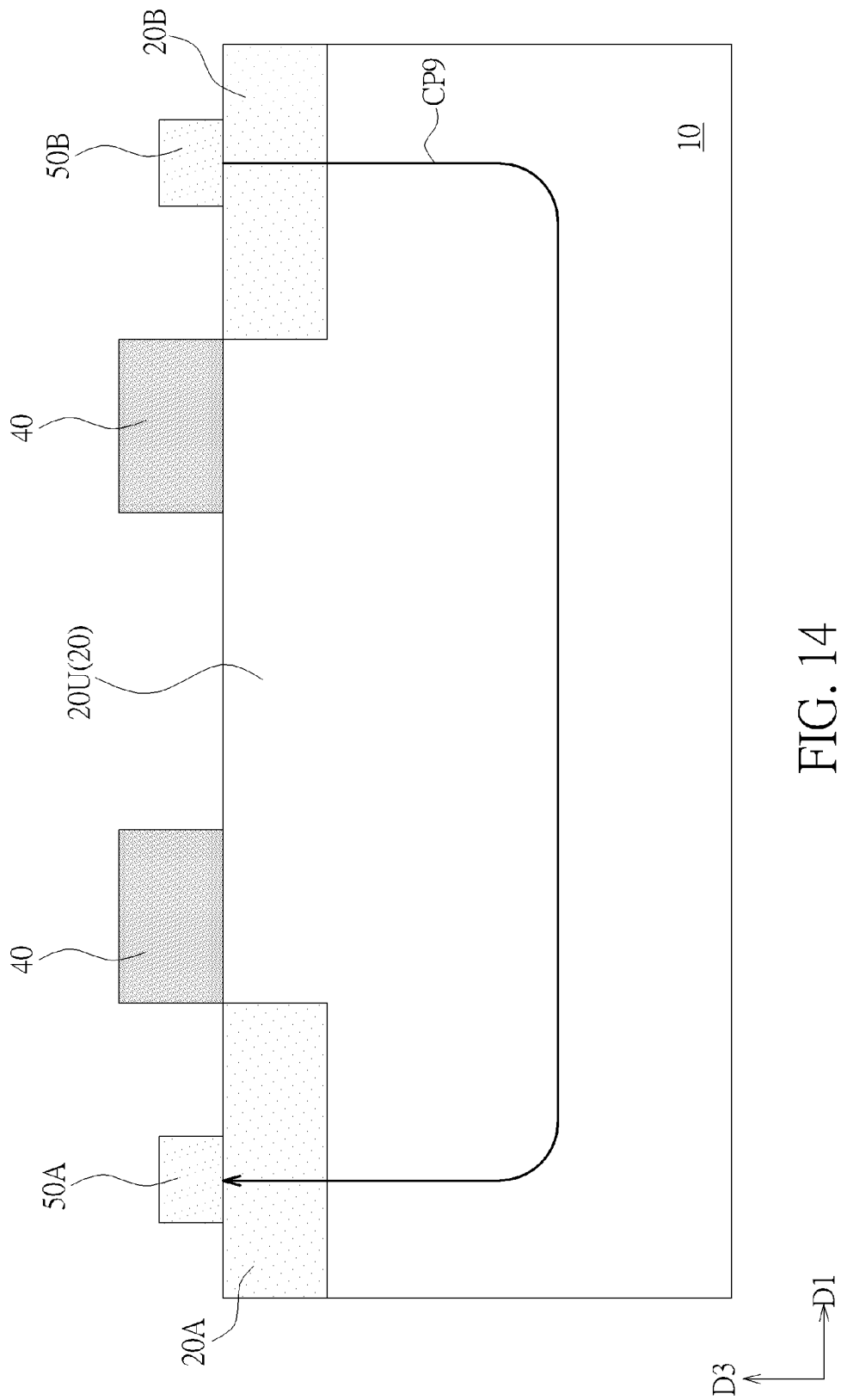
FIG. 14 is a cross-sectional drawing taken along a line D-D' in FIG. 13.

Please refer to FIG. 13 and FIG. 14. FIG. 13 is a schematic top view diagram illustrating a fin type ESD protection device 109 according to a ninth embodiment of the present invention. FIG. 14 is a cross-sectional drawing taken along a line D-D' in FIG. 13. As shown in FIG. 13 and FIG. 14, the fin type ESD protection device 109 includes at least one fin structure 20 and a plurality of gate structures 40. The fin structure 20 is disposed on a semiconductor substrate 10, and the fin structure 20 extends in a first direction D1. The fin structure 20 includes at least one first section 20A, at least one second section 20B, and at least one third section 20U. A source contact 50A contacts the first section 20A, and a drain contact 50B contacts the second section 20B. The third section 20U is disposed between the first section 20A and the second section 20B in the first direction D1. The first section 20A and the second section 20B are first conductivity type sections. The gate structures 40 are disposed between a pair of the source contact 50A and the drain contact 50B in the first direction, and no section directly connected to the source contact 50A or the drain contact 50B is disposed between the gate structures 40 between a pair of the source contact 50A and the drain contact 50B. The third section 20U may include a second conductivity type section, a lightly doped first conductivity type section, or a non-doped section, but not limited thereto. In this embodiment, the fin type ESD protection device 109 may include a plurality of the fin structures 20 repeatedly disposed in the second direction D2, but not limited thereto. Each of the third sections 20U is connected to and contacts the first section 20A and the second section 20B of the same fin structure 20, and at least a part of each of the third sections 20U is disposed under one of the gate structures 40. In this embodiment, the gate structures 40 overlap a part of the third section 20U, and a part of each of the third sections is uncovered by the gate structures 40, but not limited thereto. In this embodiment, the channel resistance of the fin type ESD protection device 109 is increased by the relatively longer third section 20U, and the electric current from the drain contact 50B may be guided to the source contact 50A by passing through the second section 20B, the bulk region in the semiconductor substrate 10 (such as the second conductivity type well in the semiconductor substrate 10) or/and the third section 20U uncovered by the gate structures 40, and the first section 20A sequentially (such as a current path CP9 shown in FIG. 14) instead of directly passing through the fin structure 20 under the gate structures 40. The ESD protection ability of the fin type ESD protection device 109 may be enhanced accordingly.

Figure 15:
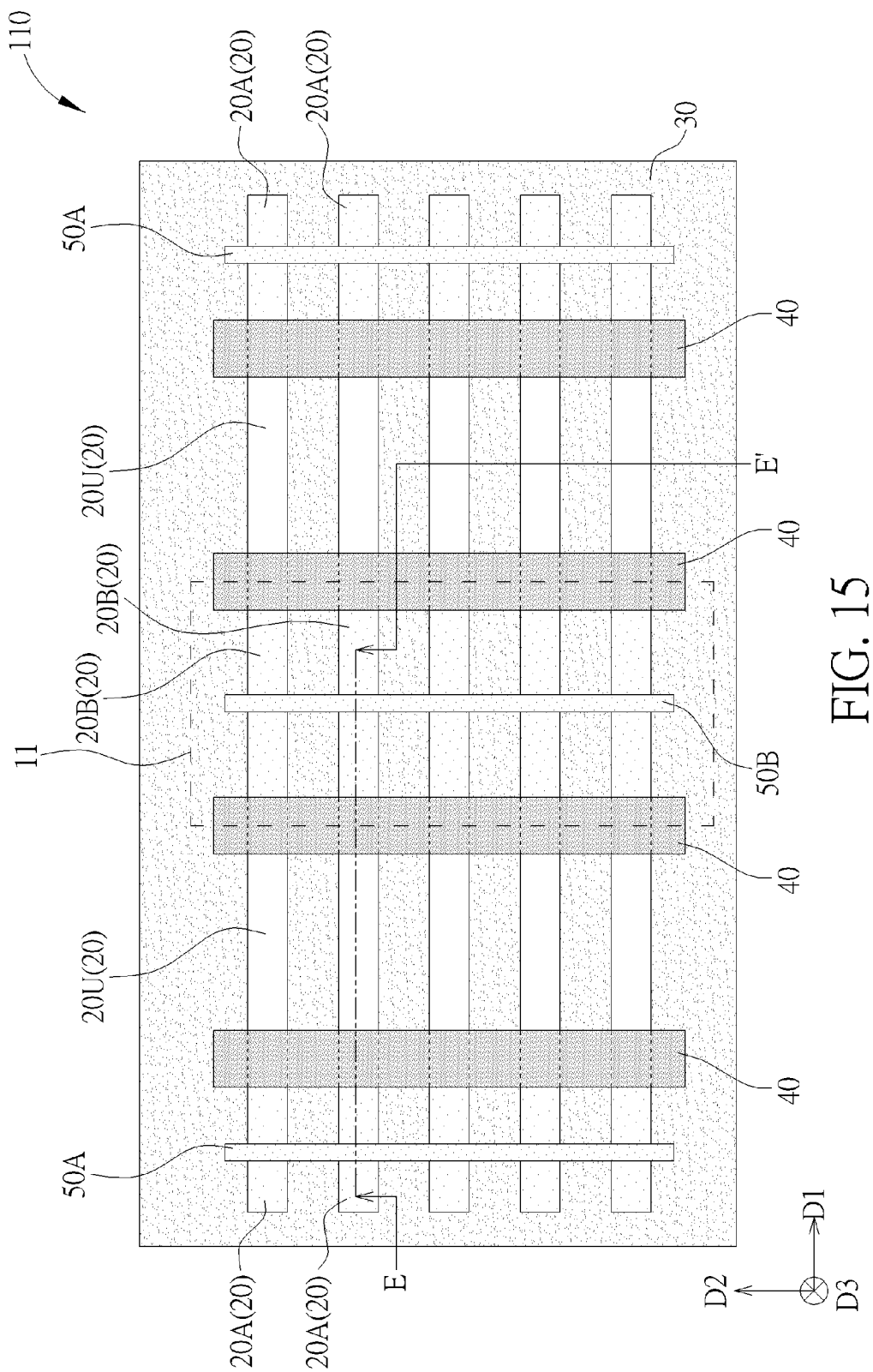
FIG. 15 is a schematic top view diagram illustrating a fin type ESD protection device according to a tenth embodiment of the present invention.
Figure 16:
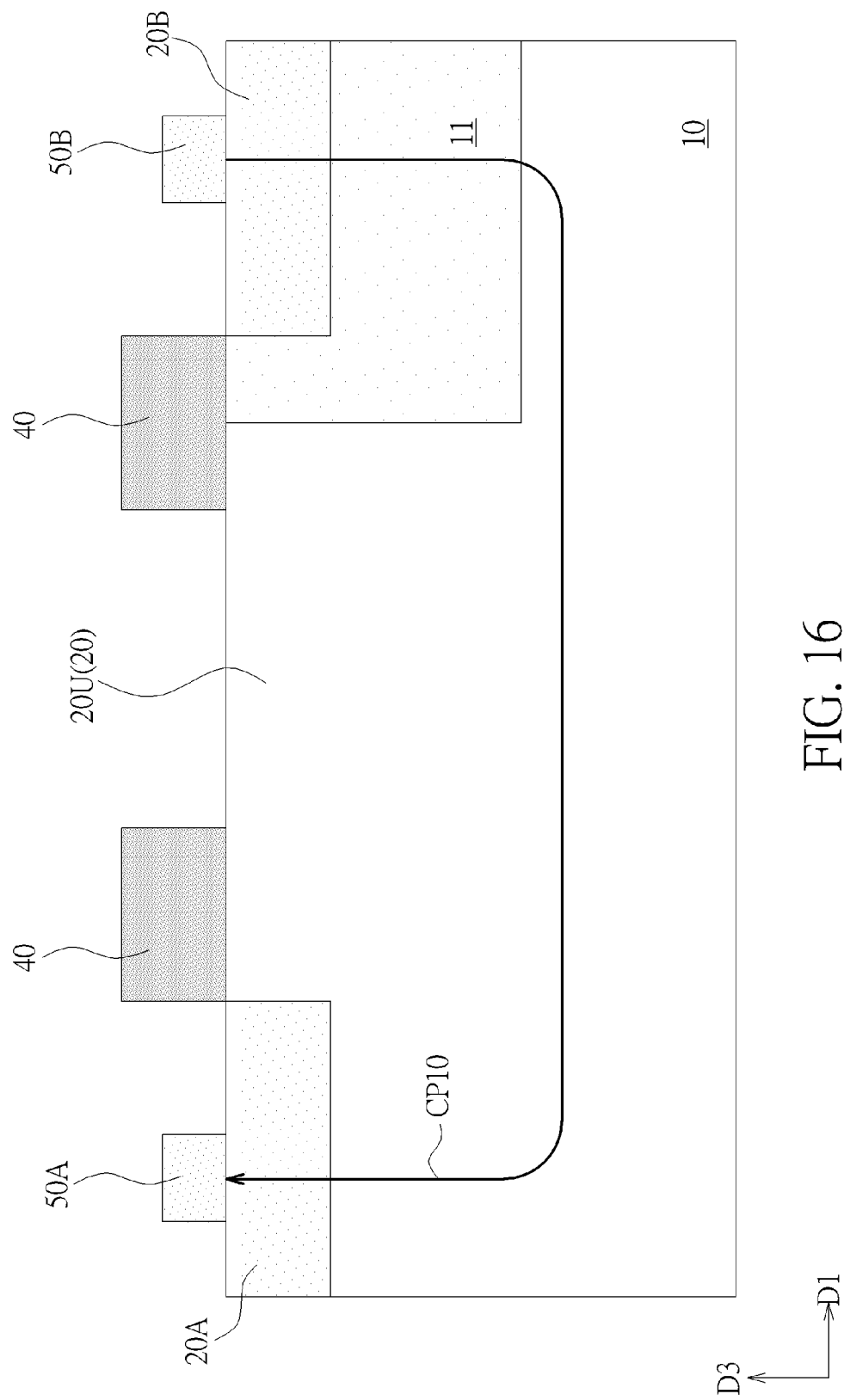
FIG. 16 is a cross-sectional drawing taken along a line E-E' in FIG. 15.

Please refer to FIG. 15 and FIG. 16. FIG. 15 is a schematic top view diagram illustrating a fin type ESD protection device 110 according to a tenth embodiment of the present invention. FIG. 16 is a cross-sectional drawing taken along a line E-E' in FIG. 15. As shown in FIG. 15 and FIG. 16, the difference between the fin type ESD protection device 110 in this embodiment and the fin type ESD protection device in the ninth embodiment is that the fin type ESD protection device 110 further includes the first conductivity type well 11 disposed in the semiconductor substrate 10. The second sections 20B are disposed on the first conductivity type well 11, and the second sections 20B contact and are electrically connected to the first conductivity type well 11. The first conductivity type well 11 may extend to a region under the gate structure 40 adjacent to the second section 20B, and at least one of the gate structures 40 may overlap a part of the first conductivity type well 11 in the vertical direction D3. The first conductivity type well 11 may contact the third section 20U under the gate structure 40. In this condition, the electric current from the drain contact 50B may be guided to the source contact 50A by passing through the second section 20B, the first conductivity type well 11, the bulk region in the semiconductor substrate 10 or/and the third section 20U uncovered by the gate structures 40, and the first section 20A sequentially (such as a current path CP10 shown in FIG. 16) instead of directly passing through the fin structure 20 under the gate structures 40, and the ESD protection ability of the fin type ESD protection device 110 may be further enhanced accordingly.

Figure 17:
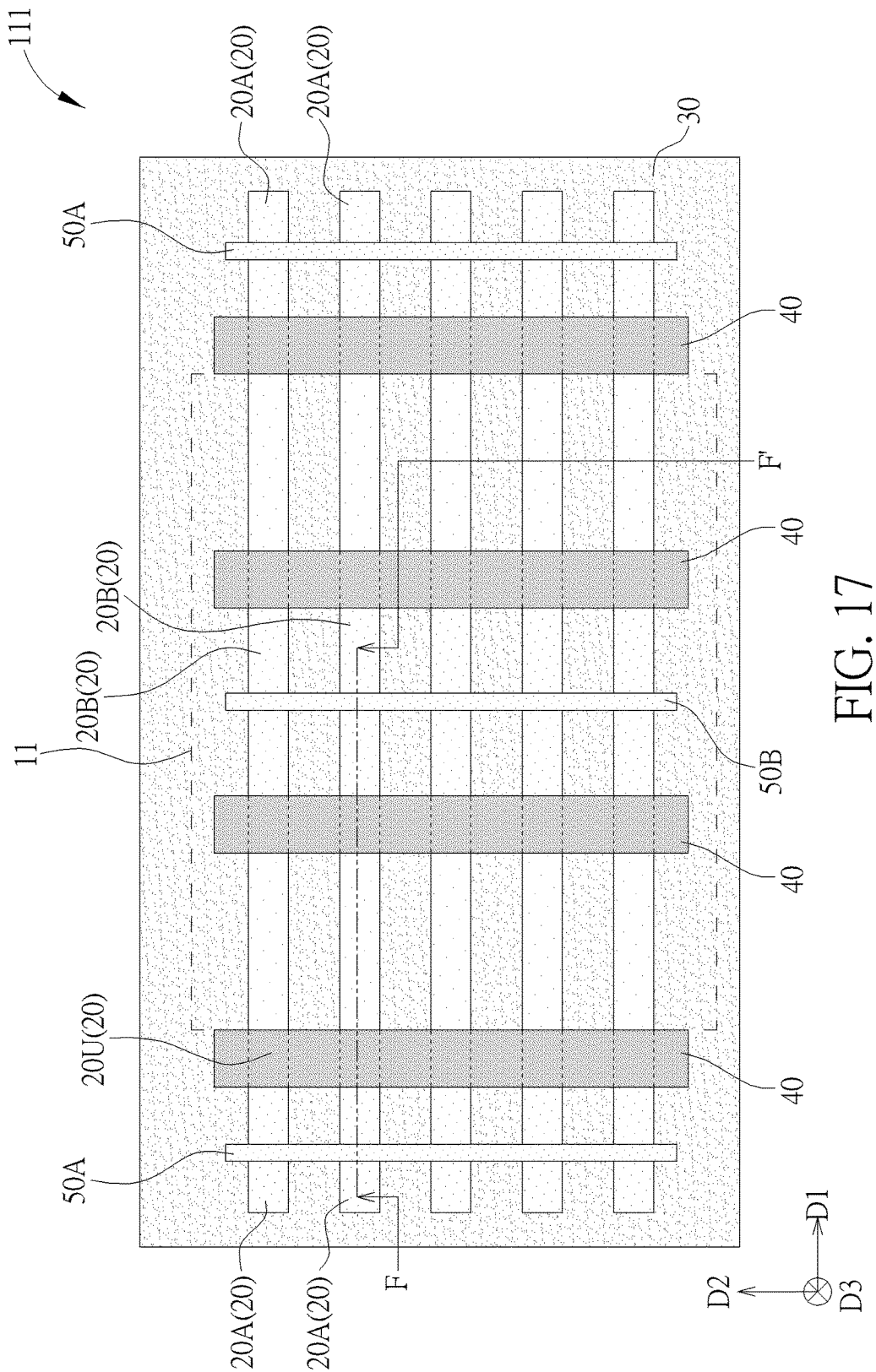
FIG. 17 is a schematic top view diagram illustrating a fin type ESD protection device according to an eleventh embodiment of the present invention.
Figure 18:
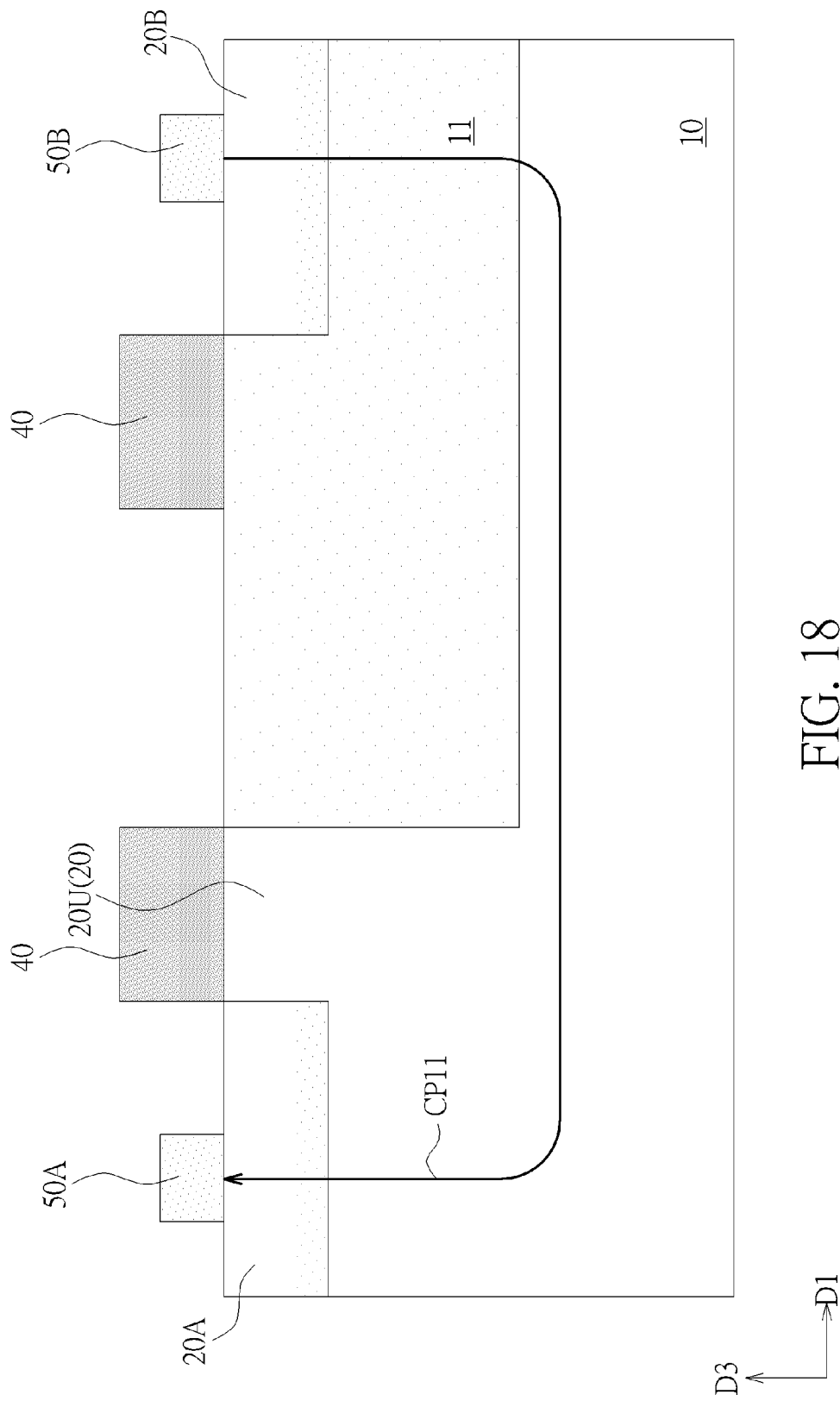
FIG. 18 is a cross-sectional drawing taken along a line F-F' in FIG. 17.

Please refer to FIG. 17 and FIG. 18. FIG. 17 is a schematic top view diagram illustrating a fin type ESD protection device 111 according to an eleventh embodiment of the present invention. FIG. 18 is a cross-sectional drawing taken along a line F-F' in FIG. 17. As shown in FIG. 17 and FIG. 18, the difference between the fin type ESD protection device 111 in this embodiment and the fin type ESD protection device in the tenth embodiment is that at least a part of the first conductivity type well 11 is disposed between and uncovered by the gate structures 40 disposed between a pair of the source contact 50A and the drain contact 50B. In other words, the first conductivity type well 11 extends to the gate structure 40 adjacent to the first section 20A of the fin structure 20, and the first conductivity type well 11 may be connected to the third section 20U under the gate structure 40 adjacent to the first section 20A. The fin type ESD protection device 111 may then be a workable transistor accordingly, but not limited thereto. Additionally, the electric current from the drain contact 50B may be guided to the source contact 50A by passing through the second section 20B, the first conductivity type well 11, the bulk region in the semiconductor substrate 10, and the first section 20A sequentially (such as a current path CP11 shown in FIG. 18), and the ESD protection ability of the fin type ESD protection device 111 may be enhanced accordingly.

To summarize the above descriptions, in the fin type ESD protection device of the present invention, the current path is changed by separating the fins connected to the source contact and the drain contact respectively or increasing the channel resistance of the fin type ESD protection device. The current from the drain contact may be guided to the source contact by passing through the bulk region or/and the first conductivity type well in the semiconductor substrate instead of directly passing through the fin under the gate structure, and the ESD protection ability of the fin type ESD protection device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A fin type electrostatic discharge (ESD) protection device, comprising:
    at least one fin structure disposed on a semiconductor substrate, wherein the fin structure extending in a first direction, and the fin structure comprises:
        at least one first section, wherein a source contact contacts the first section;

at least one second section, wherein a drain contact contacts the second section, wherein the first section and the second section are first conductivity type sections; and at least one third section disposed between the first section and the second section in the first direction, wherein the third section directly contacts and is directly connected to the first section, and the third section is a lightly doped first conductivity type section or a non-doped section; and a plurality of gate structures disposed between the source contact and the drain contact in the first direction, wherein there is not any section of the fin structure directly connected to the source contact or the drain contact and disposed between the gate structures.

2. The fin type ESD protection device of claim 1, wherein at least a part of the third section is disposed under one of the gate structures.

3. The fin type ESD protection device of claim 2, wherein a part of the third section is uncovered by the gate structures.

4. The fin type ESD protection device of claim 1, further comprising a first conductivity type well disposed in the semiconductor substrate, wherein the second section is disposed on the first conductivity type well, and the second section contacts and is electrically connected to the first conductivity type well.

5. The fin type ESD protection device of claim 4, wherein at least one of the gate structures overlaps a part of the first conductivity type well in a vertical direction.

6. The fin type ESD protection device of claim 4, wherein at least a part of the first conductivity type well is disposed between and uncovered by the gate structures disposed between the source contact and the drain contact.

7. A fin type electrostatic discharge (ESD) protection device, comprising:
at least one fin structure disposed on a semiconductor substrate, wherein the fin structure extending in a first direction, and the fin structure comprises:
at least one first section, wherein a source contact contacts the first section;
at least one second section, wherein a drain contact contacts the second section, wherein the first section and the second section are first conductivity type sections; and
at least one third section disposed between the first section and the second section in the first direction; and
a plurality of gate structures disposed between the source contact and the drain contact in the first direction, wherein there is not any section of the fin structure directly connected to the source contact or the drain contact and disposed between the gate structures, wherein at least a part of a topmost surface of the third section is not covered by the gate structures, and the third section is a second conductivity type section or a non-doped section.

8. The fin type ESD protection device of claim 7, wherein the third section is connected to and contacts the first section.

9. The fin type ESD protection device of claim 7, wherein at least a part of the third section is disposed under one of the gate structures.

10. The fin type ESD protection device of claim 7, further comprising a first conductivity type well disposed in the semiconductor substrate, wherein the second section is disposed on the first conductivity type well, and the second section contacts and is electrically connected to the first conductivity type well.

11. The fin type ESD protection device of claim 10, wherein at least one of the gate structures overlaps a part of the first conductivity type well in a vertical direction.

12. A fin type electrostatic discharge (ESD) protection device, comprising:
at least one fin structure disposed on a semiconductor substrate, wherein the fin structure extending in a first direction, and the fin structure comprises:
at least one first section, wherein a source contact contacts the first section;
at least one second section, wherein a drain contact contacts the second section, wherein the first section and the second section are first conductivity type sections; and
at least one third section disposed between the first section and the second section in the first direction;
a plurality of gate structures disposed between the source contact and the drain contact in the first direction, wherein there is not any section of the fin structure directly connected to the source contact or the drain contact and disposed between the gate structures; and
a first conductivity type well disposed in the semiconductor substrate, wherein the second section is disposed on the first conductivity type well, and the second section contacts and is electrically connected to the first conductivity type well, wherein at least one of the gate structures overlaps a part of the first conductivity type well in a vertical direction, and a part of a topmost surface of the first conductivity type well is not covered by the gate structures.

13. The fin type ESD protection device of claim 12, wherein the third section comprises a second conductivity type section, a lightly doped first conductivity type section, or a non-doped section.

14. The fin type ESD protection device of claim 12, wherein the third section is connected to and contacts the first section.

15. The fin type ESD protection device of claim 12, wherein at least a part of the third section is disposed under one of the gate structures.

* * * * *